United States Patent
Upadhyay et al.

(10) Patent No.: US 12,211,563 B2
(45) Date of Patent: Jan. 28, 2025

(54) DYNAMIC GATE STEPS FOR LAST-LEVEL PROGRAMMING TO IMPROVE WRITE PERFORMANCE

(71) Applicant: Intel Corporation, Santa Clara, CA (US)

(72) Inventors: Sagar Upadhyay, Folsom, CA (US); Archana Tankasala, Santa Clara, CA (US); Aliasgar S. Madraswala, Folsom, CA (US); Shantanu Rajwade, Santa Clara, CA (US)

(73) Assignee: Intel Corportaion, Santa Clara, CA (US)

( * ) Notice: Subject to any disclaimer, the term of this patent is extended or adjusted under 35 U.S.C. 154(b) by 645 days.

(21) Appl. No.: 17/411,919

(22) Filed: Aug. 25, 2021

(65) Prior Publication Data

US 2023/0061293 A1    Mar. 2, 2023

(51) Int. Cl.
| | | |
|---|---|---|
| *G11C 16/10* | (2006.01) | |
| *G11C 16/08* | (2006.01) | |
| *G11C 16/24* | (2006.01) | |
| *G11C 16/26* | (2006.01) | |
| *G11C 16/30* | (2006.01) | |
| *G11C 16/34* | (2006.01) | |

(52) U.S. Cl.
CPC .......... *G11C 16/3459* (2013.01); *G11C 16/08* (2013.01); *G11C 16/102* (2013.01); *G11C 16/24* (2013.01); *G11C 16/26* (2013.01); *G11C 16/30* (2013.01)

(58) Field of Classification Search
CPC ... G11C 16/3459; G11C 16/08; G11C 16/102; G11C 16/24; G11C 16/26; G11C 16/30; G11C 16/32; G11C 11/5628; G11C 16/0483; G11C 16/10; G11C 16/3454; G11C 2211/5644; G11C 11/5671
See application file for complete search history.

(56) References Cited

U.S. PATENT DOCUMENTS

| | | | |
|---|---|---|---|
| 10,706,941 B1 * | 7/2020 | Lu | G11C 7/04 |
| 11,475,959 B1 * | 10/2022 | Lien | G11C 16/24 |
| 2017/0186497 A1 | 6/2017 | Rajwade et al. | |
| 2017/0371779 A1 | 12/2017 | Rajwade et al. | |
| 2019/0355431 A1 | 11/2019 | Madraswala et al. | |
| 2020/0090770 A1 * | 3/2020 | Yang | G11C 11/5628 |
| 2020/0194078 A1 * | 6/2020 | Kondo | G11C 16/10 |
| 2021/0050054 A1 * | 2/2021 | Ray | G11C 16/26 |
| 2022/0293197 A1 * | 9/2022 | Prakash | G11C 16/10 |
| 2023/0061293 A1 * | 3/2023 | Upadhyay | G11C 16/102 |

* cited by examiner

*Primary Examiner* — Hien N Nguyen
(74) *Attorney, Agent, or Firm* — Jordan IP Law, LLC

(57) ABSTRACT

Systems, apparatuses and methods may provide for technology that conducts a pulse-verify loop sequence from a first program level in targeted NAND memory cells to a next-to-last program level in the memory cells, wherein the pulse-verify loop sequence includes an issuance of a program pulse and one or more verify pulses to the memory cells on a per program level basis, and wherein successive program pulses differ from one another by a gate step voltage amount. The technology may also issue a last level program pulse to the memory cells at a last program level, issue a single verify pulse to the memory cells after the last level program pulse, and issue a gate step pulse to the memory cells at a variable program level, wherein the variable program level differs from the last program level by an amount that is greater than the gate step voltage amount.

20 Claims, 3 Drawing Sheets

DYNAMIC GATE STEPS FOR LAST-LEVEL PROGRAMMING TO IMPROVE WRITE PERFORMANCE

TECHNICAL FIELD

Embodiments generally relate to memory structures. More particularly, embodiments relate to dynamic gate steps for last-level programming to improve write performance in non-volatile memory (NVM) structures.

BACKGROUND

In solid state drives (SSDs), multi-level NAND-type flash memory ("NAND memory") may be organized into multiple cells, with each cell containing multiple bits of data. In such a case, cells are typically programmed into one of $2^N$ possible levels to store N bits of information. To read this data, a series of read operations at predetermined read levels (e.g., a subset of $2^N$-1 read levels) are performed. For example, in a tri-level cell (TLC) NAND device, programming is achieved by placing the threshold voltage ($V_t$) of each cell into one of eight possible threshold voltage levels (L0, L1, . . . , L7) based on three bits of data that is written into the cell. The threshold voltage may be achieved by applying a series of program pulses with increasing magnitude to a control gate of targeted NAND cells, with each pulse being followed by a series of verify steps to compare the threshold voltage of the targeted NAND cells against specific verify levels.

A program pulse followed by number of program verify steps may be referred to as a pulse-verify loop. To reduce the number of program verify steps in a pulse-verify loop, a technique known as predictive count fail byte (CFBYTE) and/or count fail bit (CFBIT) may be used. In such a case, the number of failing bytes/bits may be counted based on previous program verify information for a specific programming level and compared against a configurable CFBYTE/CFBIT criteria under the given pulse, where a prediction is made that if the number of failing bytes/bits is less than the criteria, then the given pulse is strong enough to pass that many remaining cells for that specific level. Accordingly, the same level verify pulses may be skipped after that pulse to save program time ($t_{PROG}$). During conventional TLC program operation, however, the pulse-verify loop of the last level (e.g., TLC level 7/L7) effectively involves two program pulses and two L7 verify pulses to complete programming. More particularly, the CFBYTE/CFBIT check during the first L7 pulse fails and an additional program pulse with an increased magnitude is issued to pass the remaining L7 targeted cells. As a result, a negative impact on the program time may be encountered.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

During the programming of multi-level NAND memory, cells reaching their respective target levels (e.g., determined during the verification pulses) are inhibited in all subsequent program pulses. This operation may continue until all cells in the page reach their target threshold voltage. Most memories, however, allow a certain small fraction of cells to be "left behind", referred to as a count fail byte (CFBYTE). This CFBYTE number is generally selected based on the error correction code (ECC) capability of the memory, and is often about 10 to 100 times lower than the ECC limit. As long as the total failing cells (for that level) are below the CFBYTE criterion, the failure to program these memory cells is allowed and they are further inhibited from further programming in all subsequent program pulses. Moreover, the memory controller may also stop issuing verify pulses for that level in all subsequent program loops.

Determining whether a particular level has passed or failed the CFBYTE criterion involves a counting process. This counting of the number of cells occurs after every program loop and is often time consuming. Therefore, this process is usually run in parallel with the program pulse in the next program loop. If the number of failing cells is below a certain predetermined CFBYTE criterion, memory controller logic may stop issuing verify pulses for that level and inhibit these cells in all future program pulses.

Figure 1:
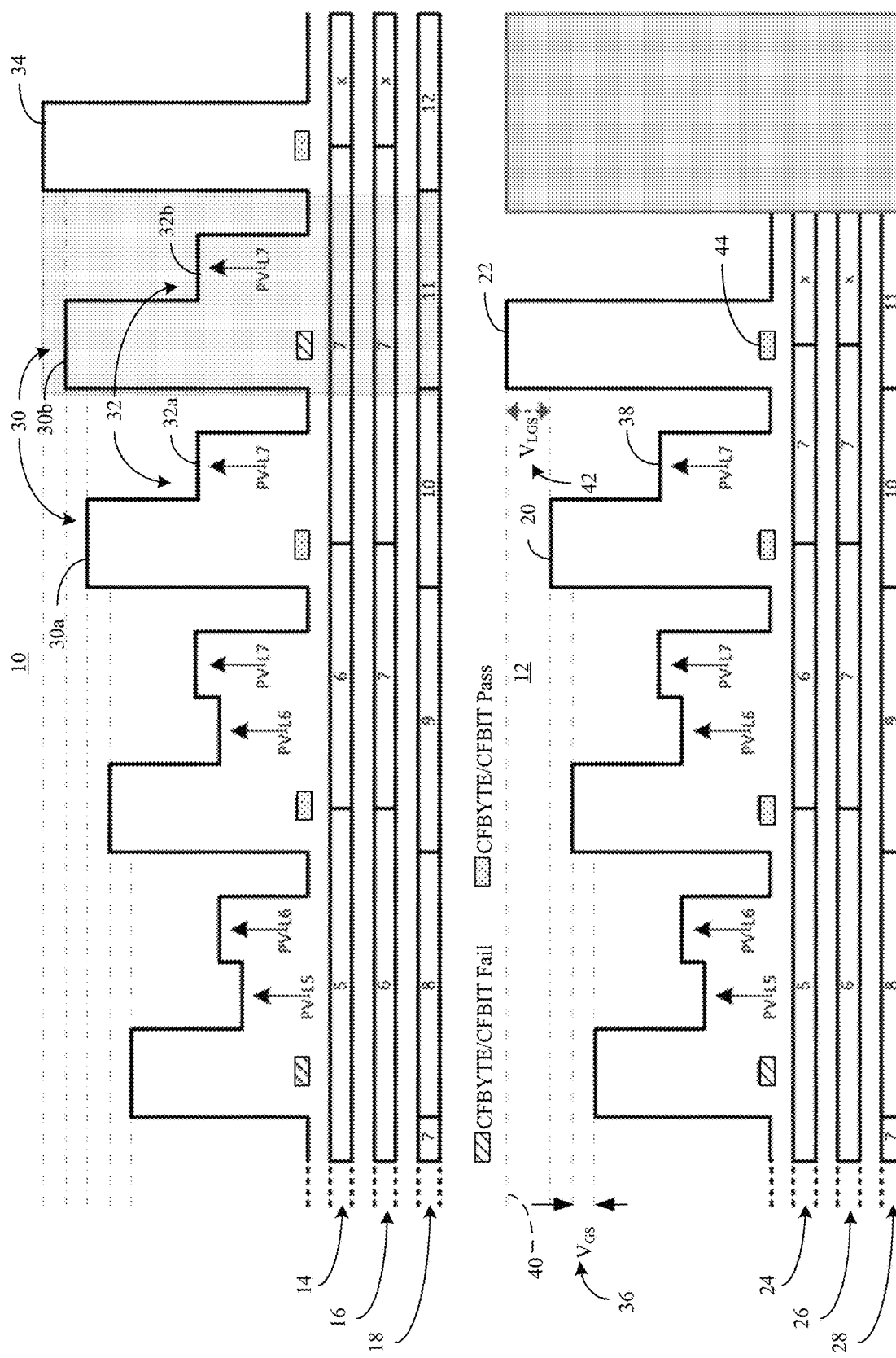
FIG. 1 is a comparative plot of an example of a conventional program operation and a program operation according to an embodiment.

Turning now to FIG. 1, a comparison is shown between a conventional program operation 10 and an enhanced program operation 12 with a variable (e.g., dynamic) last level gate step (GS). In the illustrated example, the conventional program operation 10 has a current programming level 14 (e.g., the level for which predictive CFBYTE is performed under the program pulse), a last verify level 16 (e.g., the last level for which program verify is performed in that pulse-verify loop), and a pulse/loop count 18 (e.g., the number of pulse-verify loops at given point of program operation). Similarly, the enhanced program operation 12 has a current programming level 24, a last verify level 26, and a pulse/loop count 28.

During the conventional program operation 10 (e.g., for TLC) it is observed that L7, which is the last level to program, effectively requires two program pulses 30 (30a, 30b) and two L7 verify pulses 32 (32a, 32b) to complete programming, which indicates that a CFBYTE/CFBIT check fails during a first program pulse 30a and therefore a second program pulse 30b with an increased magnitude is issued to pass the remaining L7 targeted cells. When the current programming level 14 is "6", the CFBYTE check is passing for level L6, so the L6 verify is eliminated going forward and only the L7 verify is performed. On the next pulse, a CFBYTE for L7 is performed, which fails, and then the pulse after that passes the L7 CFBYTE check. A second verify pulse 32b is followed by a gate step pulse 34, in the illustrated example.

By contrast, the enhanced program operation 12 with a variable last level GS, starts with a first program pulse 20 at the L7 program level and then issues a gate step pulse 22 with a substantially higher magnitude. The predictive CFBYTE/CFBIT criteria is also configured higher than the non-L7 levels because the gate step pulse 22 pulse with a higher magnitude is expected to pass a greater number of cells than the second program pulse 30b (e.g., with an increased magnitude of a fixed GS) of the conventional programming operation 10. More particularly, the enhanced program operation 12 conducts a typical pulse-verify loop sequence from a first program level (e.g., L0) in targeted NAND memory cells to a next-to-last program level (e.g., L6) in the targeted NAND memory cells, wherein the pulse-verify loop sequence includes the issuance of a program pulse and one or more verify pulses to the targeted NAND memory cells on a per program level basis. Additionally, successive program pulses differ from one another by a gate step (e.g., loop) voltage amount 36 (e.g., gate step voltage/$V_{GS}$).

The enhanced program operation 12 also issues the first program pulse 20 (e.g., last level program pulse) to the targeted NAND memory cells at the last program level (e.g., L7) and issues a single verify pulse 38 to the targeted NAND memory cells after the first program pulse 20. The gate step pulse 22 is then issued to the targeted NAND memory cells at a variable program level 40, wherein the variable program level 40 differs from the last program level by an amount 42 (e.g., last gate step voltage/$V_{LGS}$) that is greater than the GS voltage amount 36. Thus, the enhanced program operation 12 may bypass additional program pulses at the last program level and inhibit additional verification pulses after the single verify pulse 38. The enhanced program operation 12 therefore enables the L7 program level to be passed effectively with just a single program pulse 20 and saves program time compared to the conventional program operation 10.

As L7 is the last programming level for a TLC program, the margin for L7 placement is higher. Thus, to safe-guard against channel-lockup and under-programming of L7, embodiments provide for setting the variable program level 40 based on a wordline (WL) group associated with the targeted NAND memory cells (e.g., a "Word-Line Group" based configurable GS). Additionally, a selective slow program convergence (SSPC) bitline (BL) voltage of the targeted NAND memory cells may be dedicated to the last program level (e.g., with an additional signed offset for SSPC BL voltages). In one example, the additional verification pulses are inhibited based on a criteria 44 such as one or more of a count fail byte (CFBYTE) value that is dedicated to the last program level or a count fail bit (CFBIT) value that is dedicated to the last program level (e.g., dedicated CFBYTE/CFBIT criteria for last level programming).

Figure 2:
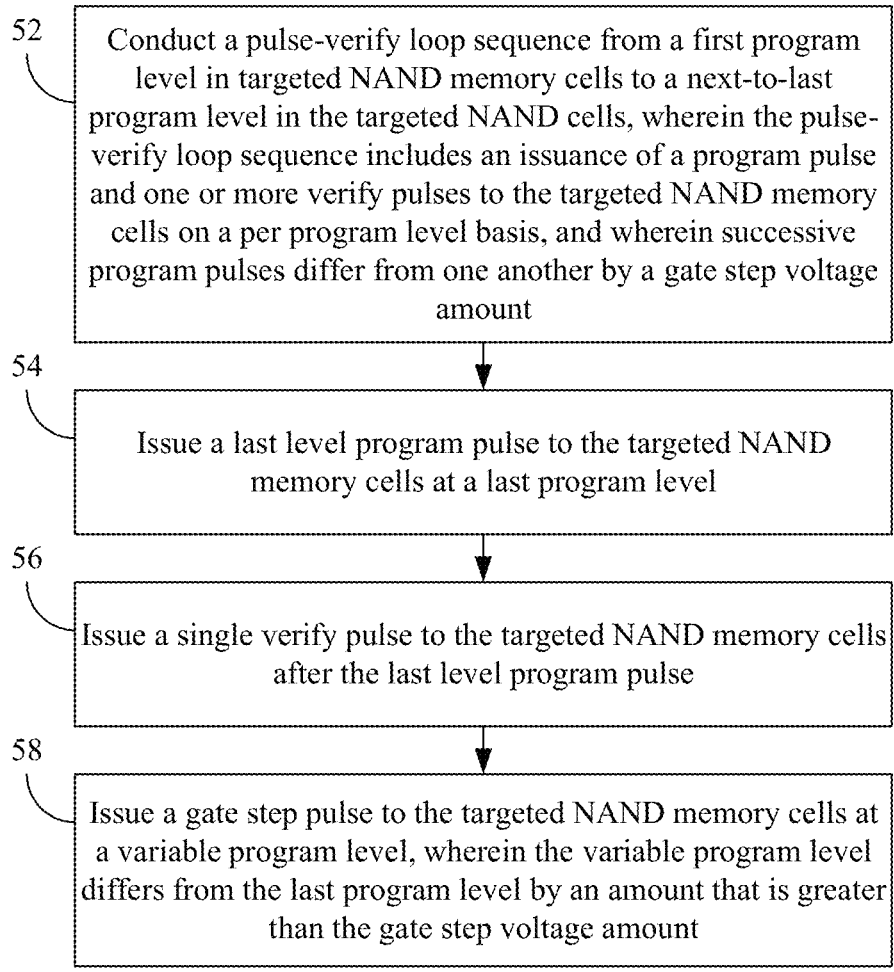
FIG. 2 is a flowchart of an example of a method of operating a performance-enhanced computing system according to an embodiment.

FIG. 2 shows a method 50 of operating a performance-enhanced computing system. The method 50 may be implemented in one or more modules as a set of logic instructions stored in a machine- or computer-readable storage medium such as random access memory (RAM), read only memory (ROM), programmable ROM (PROM), firmware, flash memory, etc., in configurable hardware such as, for example, programmable logic arrays (PLAs), field programmable gate arrays (FPGAs), complex programmable logic devices (CPLDs), in fixed-functionality hardware using circuit technology such as, for example, application specific integrated circuit (ASIC), complementary metal oxide semiconductor (CMOS) or transistor-transistor logic (TTL) technology, or any combination thereof.

Illustrated processing block 52 conducts a pulse-verify loop sequence from a first program level in targeted NAND memory cells to a next-to-last program level in the targeted NAND cells, wherein the pulse-verify loop sequence includes an issuance of a program pulse and one or more verify pulses to the targeted NAND memory cells on a per program level basis. In the illustrated example, successive program pulses differ from one another by a gate step voltage amount. The targeted NAND memory cells may be tri-level cells (TLC), quad-level cells (QLC), penta-level cells (PLC), and so forth.

Block 54 issues a last level program pulse to the targeted NAND memory cells at a last program level, wherein block 56 issues a single verify pulse to the targeted NAND memory cells after the last level program pulse. In an embodiment, block 56 inhibits additional verification pulses after the single verify pulse. For example, the additional verification pulses may be inhibited based on one or more of a CFBYTE value that is dedicated to the last program level or a CFBIT value that is dedicated to the last program level. Block 58 issues a gate step pulse to the targeted NAND memory cells at a variable program level, wherein the variable program level differs from the last program level by an amount that is greater than the gate step voltage amount. In one example, the variable program amount is set based on a WL group associated with the targeted NAND memory cells. Additionally, a SSPC BL voltage of the targeted NAND memory cells may be dedicated to the last program level. Moreover, the method 50 may bypass an additional program pulse at the last program level. The method 50 therefore enhances performance at least to the extent that issuing a single verify pulse and/or issuing a gate step pulse at the variable program level reduces programming time.

Figure 3:
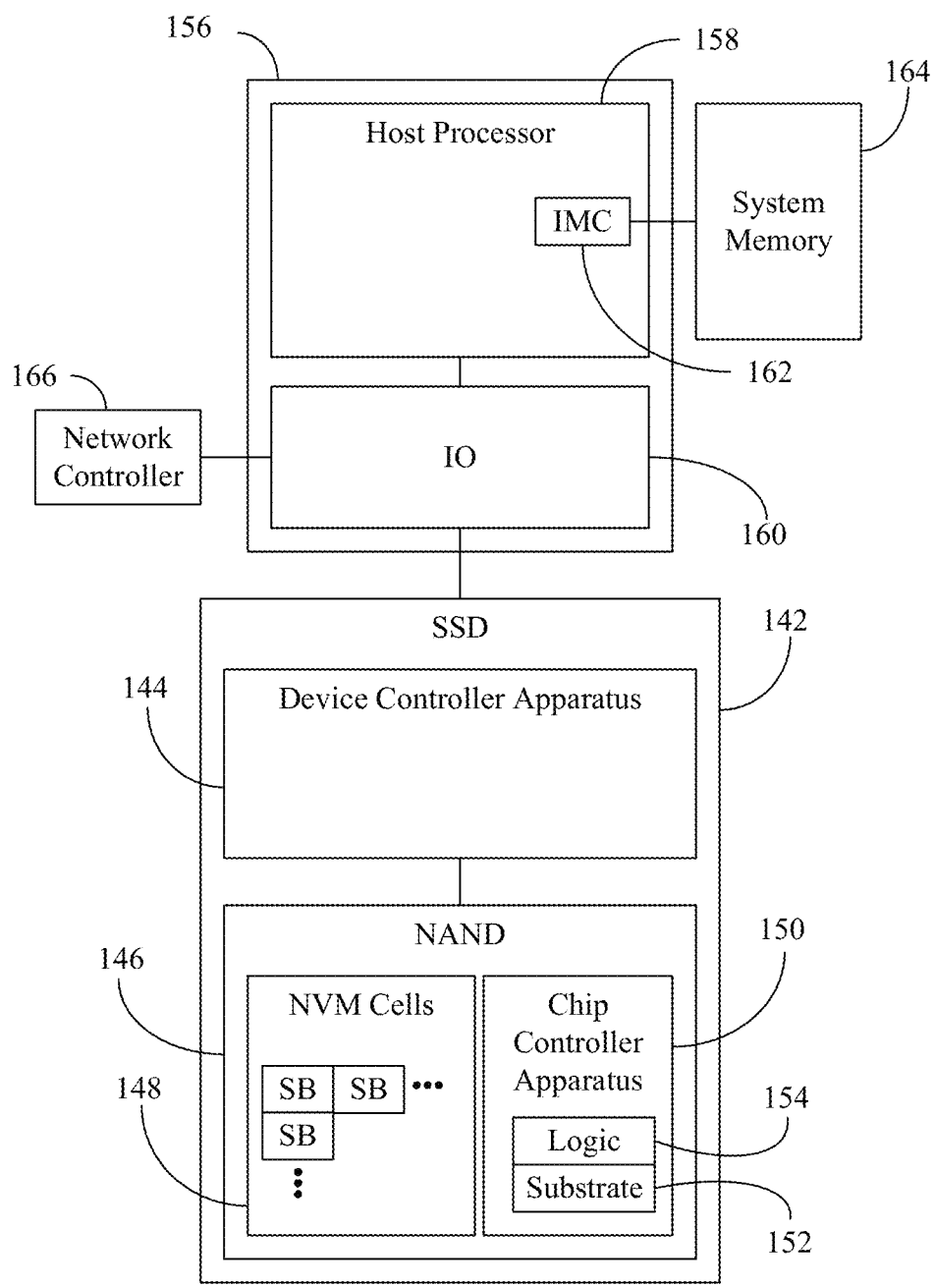
FIG. 3 is a block diagram of an example of a performance-enhanced computing system according to an embodiment.

Turning now to FIG. 3, a performance-enhanced computing system 140 is shown. In the illustrated example, a solid state drive (SSD) 142 includes a device controller apparatus 144 that is coupled to a NAND 146. The illustrated NAND 146 includes a set of NVM cells 148 (e.g., having a plurality of NAND sub-blocks/SBs and targeted NAND memory cells) and a chip controller apparatus 150 that includes a substrate 152 (e.g., silicon, sapphire, gallium arsenide) and logic 154 (e.g., transistor array and other integrated circuit/IC components) coupled to the substrate 152. The logic 154, which may include one or more of configurable or fixed-functionality hardware, may be configured to perform one or more aspects of the method 50 (FIG. 2), already discussed.

More particularly, the logic 154 conducts a pulse-verify loop sequence from a first program level in the targeted NAND memory cells to a next-to-last program level in the targeted NAND memory cells, wherein the pulse-verify loop sequence includes an issuance of a program pulse and one or more verify pulses to the targeted NAND memory cells on a per program level basis. Successive program pulses differ from one another by a gate step voltage amount (e.g., fixed $V_{GS}$). The logic 154 also issues a last level program pulse to the targeted NAND memory cells at a last program level and issues a single verify pulse to the targeted NAND memory cells after the last level program pulse. Additionally, the logic 154 issues a gate step pulse to the targeted NAND memory cells at a variable program level, wherein the variable program level differs from the last program level by an amount that is greater than the gate step volage amount.

The illustrated system 140 also includes a system on chip (SoC) 156 having a host processor 158 (e.g., central processing unit/CPU) and an input/output (IO) module 160. The host processor 158 may include an integrated memory controller 162 (IMC) that communicates with system memory 164 (e.g., RAM dual inline memory modules/DIMMs). The illustrated IO module 160 is coupled to the SSD 142 as well as other system components such as a network controller 166.

In one example, the logic 154 includes transistor channel regions that are positioned (e.g., embedded) within the substrate 152. Thus, the interface between the logic 154 and the substrate 152 may not be an abrupt junction. The logic 154 may also be considered to include an epitaxial layer that is grown on an initial wafer of the substrate 152. The illustrated computing system 140 is therefore considered performance-enhanced at least to the extent that issuing a single verify pulse and/or issuing a gate step pulse at the variable program level reduces programming time.

ADDITIONAL NOTES AND EXAMPLES

Example 1 includes a semiconductor apparatus comprising one or more substrates and logic coupled to the one or more substrates, wherein the logic is implemented at least partly in one or more of configurable or fixed-functionality hardware, the logic to conduct a pulse-verify loop sequence from a first program level in targeted NAND memory cells to a next-to-last program level in the targeted NAND memory cells, wherein the pulse-verify loop sequence includes an issuance of a program pulse and one or more verify pulses to the targeted NAND memory cells on a per program level basis, and wherein successive program pulses differ from one another by a gate step voltage amount, issue a last level program pulse to the targeted NAND memory cells at a last program level, issue a single verify pulse to the targeted NAND memory cells after the last level program pulse, and issue a gate step pulse to the targeted NAND memory cells at a variable program level, wherein the variable program level differs from the last program level by an amount that is greater than the gate step voltage amount.

Example 2 includes the semiconductor apparatus of Example 1, wherein the logic is to inhibit additional verification pulses after the single verify pulse.

Example 3 includes the semiconductor apparatus of Example 2, wherein the additional verification pulses are inhibited based on one or more of a count fail byte value that is dedicated to the last program level or a count fail bit value that is dedicated to the last program level.

Example 4 includes the semiconductor apparatus of Example 1, wherein the logic is to bypass an additional program pulse at the last program level.

Example 5 includes the semiconductor apparatus of Example 1, wherein the logic is to set the variable program level based on a wordline group associated with the targeted NAND memory cells.

Example 6 includes the semiconductor apparatus of Example 1, wherein a selective slow program convergence bitline voltage of the targeted NAND memory cells is dedicated to the last program level.

Example 7 includes the semiconductor apparatus of any one of Examples 1 to 6, wherein the targeted NAND memory cells are tri-level cells.

Example 8 includes a performance-enhanced computing system comprising non-volatile memory (NVM) including targeted NAND memory cells, and a controller coupled to the NVM, wherein the controller includes logic coupled to one or more substrates, the logic to conduct a pulse-verify loop sequence from a first program level in the targeted NAND memory cells to a next-to-last program level in the targeted NAND memory cells, wherein the pulse-verify loop sequence includes an issuance of a program pulse and one or more verify pulses to the targeted NAND memory cells on a per program level basis, and wherein successive program pulses differ from one another by a gate step voltage amount, issue a last level program pulse to the targeted NAND memory cells at a last program level, issue a single verify pulse to the targeted NAND memory cells after the last level program pulse, and issue a gate step pulse to the targeted NAND memory cells at a variable program level, wherein the variable program level differs from the last program level by an amount that is greater than the gate step voltage amount.

Example 9 includes the computing system of Example 8, wherein the logic is to inhibit additional verification pulses after the single verify pulse.

Example 10 includes the computing system of Example 9, wherein the additional verification pulses are inhibited based on one or more of a count fail byte value that is dedicated to the last program level or a count fail bit value that is dedicated to the last program level.

Example 11 includes the computing system of Example 8, wherein the logic is to bypass an additional program pulse at the last program level.

Example 12 includes the computing system of Example 8, wherein the logic is to set the variable program level based on a wordline group associated with the targeted NAND memory cells.

Example 13 includes the computing system of Example 8, wherein a selective slow program convergence bitline voltage of the targeted NAND memory cells is dedicated to the last program level.

Example 14 includes the computing system of any one of Examples 8 to 13, wherein the targeted NAND memory cells are tri-level cells.

Example 15 includes a method of operating a performance-enhanced computing system, the method comprising conducting a pulse-verify loop sequence from a first program level in targeted NAND memory cells to a next-to-last program level in the targeted NAND memory cells, wherein the pulse-verify loop sequence includes an issuance of a program pulse and one or more verify pulses to the targeted NAND memory cells on a per program level basis, and wherein successive program pulses differ from one another by a gate step voltage amount, issuing a last level program pulse to the targeted NAND memory cells at a last program level, issuing a single verify pulse to the targeted NAND memory cells after the last level program pulse, and issuing a gate step pulse to the targeted NAND memory cells at a variable program level, wherein the variable program level differs from the last program level by an amount that is greater than the gate step voltage amount.

Example 16 includes the method of Example 15, further including inhibiting additional verification pulses after the single verify pulse.

Example 17 includes the method of Example 16, wherein the additional verification pulses are inhibited based on one or more of a count fail byte value that is dedicated to the last program level or a count fail bit value that is dedicated to the last program level.

Example 18 includes the method of Example 15, further including bypassing an additional program pulse at the last program level.

Example 19 includes the method of Example 15, further including setting the variable program level based on a wordline group associated with the targeted NAND memory cells.

Example 20 includes the method of any one of Examples 15 to 19, wherein a selective slow program convergence bitline voltage of the targeted NAND memory cells is dedicated to the last program level.

Example 21 includes means for performing the method of any one of Examples 15 to 20.

Technology described herein therefore provides for variable last level gate steps and enables the placement of L7 targeted cells to the corresponding threshold voltage ($V_t$>PV7) with just one configurable program pulse. Accordingly, the technology effectively saves approximately one program pulse and one verify pulse worth of programming time (tPROG) than conventional L7 program operations. Additionally, "Word-Line Group" based program gate steps in last level programming provides better configurability. Moreover, a configurable SSPC BL voltage and CFBYTE/CFBIT criteria for the last level mitigates the risk of channel lockup and under-programming. The technology helps push tail cells without reducing the CFBYTE. Accordingly, there is no tPROG tradeoff.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A semiconductor apparatus comprising:
one or more substrates; and
logic coupled to the one or more substrates, wherein the logic is implemented at least partly in one or more of configurable or fixed-functionality hardware, the logic to:
conduct a pulse-verify loop sequence from a first program level in targeted NAND memory cells to a next-to-last program level in the targeted NAND memory cells, wherein the pulse-verify loop sequence includes an issuance of a program pulse and one or more verify pulses to the targeted NAND memory cells on a per program level basis, and wherein successive program pulses differ from one another by a gate step voltage amount;
issue a last level program pulse to the targeted NAND memory cells at a last program level;
issue a single verify pulse to the targeted NAND memory cells after the last level program pulse; and
issue a gate step pulse to the targeted NAND memory cells at a variable program level, wherein the variable program level differs from the last program level by an amount that is greater than the gate step voltage amount.

2. The semiconductor apparatus of claim 1, wherein the logic is to inhibit additional verification pulses after the single verify pulse.

3. The semiconductor apparatus of claim 2, wherein the additional verification pulses are inhibited based on one or more of a count fail byte value that is dedicated to the last program level or a count fail bit value that is dedicated to the last program level.

4. The semiconductor apparatus of claim 1, wherein the logic is to bypass an additional program pulse at the last program level.

5. The semiconductor apparatus of claim 1, wherein the logic is to set the variable program level based on a wordline group associated with the targeted NAND memory cells.

6. The semiconductor apparatus of claim 1, wherein a selective slow program convergence bitline voltage of the targeted NAND memory cells is dedicated to the last program level.

7. The semiconductor apparatus of claim 1, wherein the targeted NAND memory cells are tri-level cells.

8. A computing system comprising:
non-volatile memory (NVM) including targeted NAND memory cells; and
a controller coupled to the NVM, wherein the controller includes logic coupled to one or more substrates, the logic to:
conduct a pulse-verify loop sequence from a first program level in the targeted NAND memory cells to a next-to-last program level in the targeted NAND memory cells, wherein the pulse-verify loop sequence includes an issuance of a program pulse and one or more verify pulses to the targeted NAND memory cells on a per program level basis, and wherein successive program pulses differ from one another by a gate step voltage amount,
issue a last level program pulse to the targeted NAND memory cells at a last program level, issue a single verify pulse to the targeted NAND memory cells after the last level program pulse, and issue a gate step pulse to the targeted NAND memory cells at a variable program level, wherein the variable program level differs from the last program level by an amount that is greater than the gate step voltage amount.

9. The computing system of claim 8, wherein the logic is to inhibit additional verification pulses after the single verify pulse.

10. The computing system of claim 9, wherein the additional verification pulses are inhibited based on one or more of a count fail byte value that is dedicated to the last program level or a count fail bit value that is dedicated to the last program level.

11. The computing system of claim 8, wherein the logic is to bypass an additional program pulse at the last program level.

12. The computing system of claim 8, wherein the logic is to set the variable program level based on a wordline group associated with the targeted NAND memory cells.

13. The computing system of claim 8, wherein a selective slow program convergence bitline voltage of the targeted NAND memory cells is dedicated to the last program level.

14. The computing system of claim 8, wherein the targeted NAND memory cells are tri-level cells.

15. A method comprising:

conducting a pulse-verify loop sequence from a first program level in targeted NAND memory cells to a next-to-last program level in the targeted NAND memory cells, wherein the pulse-verify loop sequence includes an issuance of a program pulse and one or more verify pulses to the targeted NAND memory cells on a per program level basis, and wherein successive program pulses differ from one another by a gate step voltage amount;

issuing a last level program pulse to the targeted NAND memory cells at a last program level;

issuing a single verify pulse to the targeted NAND memory cells after the last level program pulse; and issuing a gate step pulse to the targeted NAND memory cells at a variable program level, wherein the variable program level differs from the last program level by an amount that is greater than the gate step voltage amount.

16. The method of claim 15, further including inhibiting additional verification pulses after the single verify pulse.

17. The method of claim 16, wherein the additional verification pulses are inhibited based on one or more of a count fail byte value that is dedicated to the last program level or a count fail bit value that is dedicated to the last program level.

18. The method of claim 15, further including bypassing an additional program pulse at the last program level.

19. The method of claim 15, further including setting the variable program level based on a wordline group associated with the targeted NAND memory cells.

20. The method of claim 15, wherein a selective slow program convergence bitline voltage of the targeted NAND memory cells is dedicated to the last program level.

* * * * *